Figure 1:
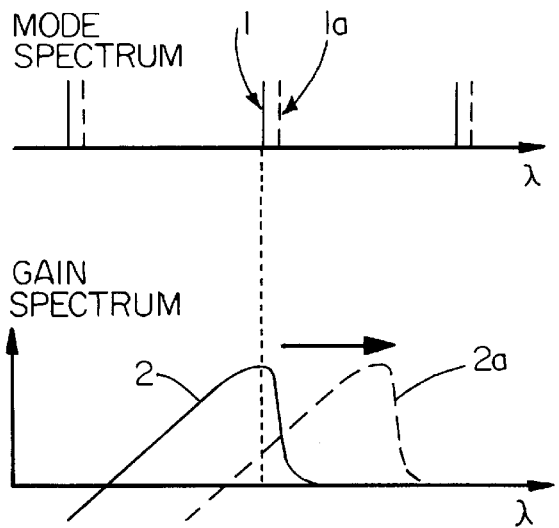

United States Patent [19]
Dawson et al.

[11] Patent Number: 5,903,585
[45] Date of Patent: May 11, 1999

[54] OPTOELECTRONIC DEVICES

[75] Inventors: Martin David Dawson, Rottenrow; Timothy David Bestwick; Haruhisa Takiguchi, both of Oxford, all of United Kingdom

[73] Assignee: Sharp Kabushiki Kaisha, Osaka, Japan

[21] Appl. No.: 08/763,714

[22] Filed: Dec. 13, 1996

[30] Foreign Application Priority Data

Feb. 15, 1996 [GB] United Kingdom .................. 9603190

[51] Int. Cl.$^6$ ....................................................... H01S 3/19
[52] U.S. Cl. ................................. 372/45; 372/44; 372/96
[58] Field of Search ................................. 372/45, 96, 46, 372/44; 257/18

[56] References Cited

U.S. PATENT DOCUMENTS

| | | | |
|---|---|---|---|
| 4,612,645 | 9/1986 | Liu et al. | 372/45 |
| 4,935,935 | 6/1990 | Reed et al. | 372/44 |
| 5,642,371 | 6/1997 | Tohyama et al. | 372/45 |
| 5,652,762 | 7/1997 | Otsuka et al. | 372/45 |
| 5,712,865 | 1/1998 | Chow et al. | 372/45 |

OTHER PUBLICATIONS

Search Report for Application No. GB 9603190.1; dated Apr. 23, 1996.
J. L. Jewell et al., IEEE Journal of Quantum Electronics, vol. 27, No. 6, pp. 1332–1346, 1991, "Vertical–Cavity Surface–Emitting Lasers: Design, Growth, Fabrication, Characterization". (Jun.).
E.F. Schubert et al., Science, vol. 265, pp. 943–945, "Highly Efficient Light–Emitting Diodes with Microcavities". (Aug.).
H. Kogelnik et al., Journal of Applied Physics, vol. 43, No. 5, pp. 2327–2335, 1972, "Coupled–Wave Theory of Distributed Feedback Lasers". (May).
M. Nakamura et al., Applied Physics Letters, vol. 25, No. 9, pp. 487–488, 1974 "GaAs$_{1-x}$Al$_x$As double–heterostructure distributed feedback diode lasers". (Nov.).
D. B. Young et al., IEEE Journal of Quantum Electronics, vol. 29, No. 6, pp. 2013–2021, 1993 "Enhanced Performance of Offset–Gain High–Barrier Vertical–Cavity Surface–Emitting Lasers". (Jun.).
E. P. O'Reilly et al., IEEE Journal of Quantum Electronics, vol. 30, No. 2, pp. 366–379, 1994 "Band–Structure Engineering in Strained Semiconductor Lasers". (Feb.).
Y. Kaneko et al., Japanese Journal of Applied Physics, vol. 32, Part 2, No. 11A, pp. L1612–L1614, 1993, "Transverse–Mode Characteristics of InGaAs/GaAs Vertical–Cavity Surface–Emitting Lasers Considering Gain Offset". (Nov.).
H. –J. J. Yeh et al., Applied Physics Letters, vol. 64, No. 12, pp. 1466–1468, 1994, "Integration of GaAs vertical–cavity surface emitting laser on Si by substrate removal". (Mar.).
H. Fathollahnejad et al., Electronics Letters, vol. 30, No. 15, pp. 1235–1236, 1994, "Vertical–cavity surface–emitting lasers integrated onto silicon substrates by PdGe contacts". (Jul.).

(List continued on next page.)

Primary Examiner—Rodney Bovernick
Assistant Examiner—Yisun Song

[57] ABSTRACT

A single cavity mode optoelectronic device, such as a VCSEL, an RCLED or a DFB laser diode, comprises an etched-pillar or mesa structure including an optically active region and strain-applying means in the form of a layer of polymer material having a coefficient of thermal expansion which is greater than that of the optically active region. The layer surrounds the optically active region so as to apply a compressive strain to the latter so as to compensate at least partially for temperature-induced changes in the gain spectrum peak of the optically active region caused by ohmic heating of the device.

15 Claims, 1 Drawing Sheet

OTHER PUBLICATIONS

Z. L. Liau et al., Applied Physics Letters, vol. 56, No. 8, pp. 737–739, 1990, "Wafer fusion: A novel technique for optelectronic device fabrication and monolithic integration". (Feb.).

G. Chen, Journal of Applied Physics, vol. 77, No. 9, pp. 4251–4258, 1995, "A comparative study on the thermal characteristics of vertical–cavity surface–emitting lasers". (May).

D. A. Cohen, Tuesday Afternoon, CLEO '95, pp. 153–154 "CTuQ5"(May).

European Search Report for Application No. 96309087.3; Dated Mar. 3, 1997.

D. A. Cohen et al.; Applied Physics Letters, vol. 69, No. 4, Jul. 22, 1996, pp. 455–457, "Reduced Temperature Sensitivity of the Wavelength of a Diode Laser in a Stress–Engineered Hydrostatic Package."

OPTOELECTRONIC DEVICES

The present invention relates to single cavity mode optoelectronic devices, for example, semiconductor laser devices incorporating a distributed Bragg reflector (DBR), such as Vertical Cavity Surface Emitting Laser Diodes (VCSELs), Resonant Cavity Light Emitting Diodes (RCLEDs) and edge-emitting Distributed Feedback (DFB) laser diodes.

VCSELs and RCLEDs are epitaxial semiconductor p-i-n structures which emit light in a direction normal to the growth plane of the device. In these devices, the cavity is formed from a thin Fabry-Perot etalon. The etalon has mirrors which are typically formed from quarter wave multilayer semiconductor or dielectric DBRs. For VCSELs, both mirrors have a reflectivity in excess of approximately 99%. In the case of RCLEDs, one mirror has a reduced reflectivity of about 90%. Examples of such devices are given in IEEE Journal of Quantum Electronics Vol. 27, No. 6, pages 1332–1346 (1991) and Science, Vol. 265 (1994), pages 943–945.

DFB laser diodes differ from VCSELs and RCLEDs. DFB laser diodes emit light from the edge of the optically active region of the device. A wavelength selective grating forms part of the cavity structure of the device. The frequency selectivity of the Bragg reflection from the grating aids production of a single longitudinal mode of operation whilst maintaining the mode at high drive currents under frequency modulation conditions. Examples of DFB laser devices and their characteristics are set out in Journal of Applied Physics Vol. 43, No. 5 (1972), pages 2327–2335 and Applied Physics Letters, Vol. 25, No. 9 (1974), pages 487–488.

Ohmic heating has been identified as the major factor limiting the continuous wave power output of the above devices. In the case of VCSELs, ohmic heating is due primarily to the resistance of DBRs to current flow caused by the potential well/barrier structure of the DBR. The structure can cause the temperature of the optically active region of the device to reach between 100° C. and 200° C. in continuous wave (cw) operation. As the temperature of the optically active region rises, the band gap of the optically active region decreases and the peak of the gain spectrum moves rapidly, or shifts, to longer wavelengths.

In addition to the gain shift, the cavity mode also shifts to a longer wavelength, but at a slower rate. The degree to which the gain spectrum peak and the cavity mode shift is material dependent. For example, for a VCSEL having an optically active region formed from InGaAs, a gain spectrum peak shift of 0.32 nm/°C. and a cavity mode shift of 0.08 nm/°C. has been reported in IEEE Journal of Quantum Electronics Vol. 29, No. 6, pages 2013–2021 (1993).

Thus, on account of the different rates at which the gain spectrum peak and the cavity mode respectively shift as the drive current is increased, they do not track. This phenomenon is known as "gain offset" effect. FIG. 1 shows an example of the cavity mode spectrum and the gain spectrum of a VCSEL. The heating of the optically active region causes the cavity mode to shift from position 1 to position 1a. Similarly, the heating of the optically active region causes the gain spectrum peak to shift from position 2 to position 2a. The different rates of shift cause a mismatch between the cavity mode and the gain spectrum peak, which results in less than optimum gain of the lasing mode of the VCSEL.

Further, the above described gain offset effect is accentuated in VCSELs, because the cavity length of a VCSEL is much shorter than that of a conventional edge-emitting laser device. For example, VCSEL cavities are between 0.1 μm and 1.0 μm, whereas edge-emitting laser cavities are in the range of hundreds of micrometres in length, i.e. up to three orders of magnitude greater. The VCSEL mode spacing is thus typically several times greater than the bandwidth of the gain spectrum of the optically active material and so only a single cavity mode exists within the gain spectrum. Therefore, as the temperature increases, the lasing mode cannot "hop" to a different cavity mode.

A similar situation exists for DFB edge-emitting laser diodes. DFB laser diodes have a large mode spacing compared with standard devices using Fresnel reflection from cleaved facets. The large mode spacing creates a situation similar to that of VCSELs in which a single cavity mode exists within the gain spectrum. Thus, the gain offset effect results in the gain of the cavity mode of a DFB laser device being a function of temperature.

Attempts have been made to try to reduce ohmic heating in VCSELs by lowering the resistance of the p-type upper mirrors. One way of achieving lower resistance DBRs is to minimize the abrupt interfaces between the DBR layers by adding graded superlattice layers between the layers of the DBR.

Another technique for lowering the resistance of the p-type upper mirror formed from alternating layers of AlGaAs and AlAs involves keeping the maximum difference in Al content less than 60% between adjacent layers.

An alternative solution to the problem of ohmic heating involves modifying the current injection path. A highly conducting p-type intracavity spacing layer is located just above the optically active region and is contacted directly thereto, thus by-passing the p-type DBR.

All of the above-described attempts to obviate the problems caused by resistive heating of p-type DBR mirrors are disclosed in IEEE Journal of Quantum Electronics, Vol. 27, No. 6, pages 1332–1346 (1991). However, although the techniques set out in this document have reduced the problems caused by ohmic heating in VCSELs, they have not reduced the ohmic heating to a sufficiently low level.

It has been previously proposed to stabilize the wavelength of edge-emitting diode lasers by using a reverse mesa ridge structure coated with a high expansion coefficient metal, such as gold, and encapsulating it in a thick low expansion coefficient layer, such as $SiO_2$. Such a structure is taught in Conference on Lasers and Electro-Optics, Vol. 15 OSA Technical Digests Series (Optical Society of America, Washington D.C., 1995), Paper CTuQ5, pages 153–154. However, this document teaches wavelength stabilization in the context of edge-emitting laser devices of the conventional cleaved facet mirror type. Clearly, such teachings would not apply to VCSELs, RCLEDs or DFB laser diodes, since only a single cavity mode exists within the gain spectrum of these latter devices, whereas the mode spectrum for conventional cleaved facet edge-emitting mirror devices is much denser; this is due to their longer cavity lengths. Thus, the conventional cleaved facet mirror devices can hop between cavity modes to track the gain peak as it shifts with increase in temperature of the optically active region.

U.S. Pat. No. 4,935,935 discloses a semiconductor laser device in which at least one thin piezoelectric film is positioned in stress-transmitting relation to an optically active layer of the laser device. Electric signals passed to the film causes stress to be transmitted to the optically active layer so that the energy gap of the laser device can be varied thereby to permit the emission wavelength to be tuned to the desired wavelength. It is also disclosed in the preamble of U.S. Pat. No. 4,935,935 that dynamic single mode lasers can be tuned over a restricted wavelength range by adjusting their temperatures.

It is therefore an object of the present invention to obviate or mitigate the above-mentioned problem caused by ohmic heating in single cavity mode optoelectronic devices.

According to the present invention, there is provided a single cavity mode optoelectronic device having an optically active region, characterised by the provision of strain-applying means which is arranged to apply to the active region a strain which varies with temperature in a manner which at least partly compensates for temperature-induced changes in the gain spectrum peak of the optically active region.

By applying a strain to the optically active region of the optoelectronic device, the energy gap of the optically active region is increased, thereby compensating at least partially, and preferably substantially completely, for the above described temperature-induced reduction in the energy gap of the optically active region.

The device is therefore less sensitive to overall changes in temperature of the device and offers the possibility of improved output power capability in continuous wave operation due to the ability of the device to maintain the gain for a given cavity mode.

Thus, it is possible to provide a single cavity mode optoelectronic device which can maintain a more advantageous relationship between the cavity mode and the peak of the gain spectrum, independent of drive current or ohmic heating effects, than has heretofore been possible.

As indicated above, the present invention is particularly applicable to optoelectronic devices having a single cavity mode, as opposed to multiple cavity modes as in conventional edge emitting lasers of the cleaved facet mirror type. The present invention is more particularly applicable to single mode optoelectronic devices having a distributed optical feedback, produced for example by Bragg reflection. Specific examples of such devices are the VCSELs, RCLEDs and DFB laser diodes mentioned above.

Without the induction of strain on the optically active region, the thermal distribution of holes becomes progressively weighted to higher energy states as the temperature of the optically active region increases. Thus, a larger fraction of the hole population will be in light hole and higher energy hole states, resulting in the spectral broadening and lowering of the gain peak. However, the application of a compressive strain in accordance with the present invention enhances the splitting between heavy and light hole valence bands. The enhanced splitting of the valence bands results in fewer holes having sufficient thermal energy to occupy the higher energy states, thus helping to maintain the peak gain. It is also advantageous to arrange for the strain-applying means to apply a strain to the confining hetero-barriers adjacent the optically active region of the device, thereby causing the direct energy gaps of the hetero-barriers to shift in a corresponding manner relative to the optically active region. Thus, the confining potential neighbouring the optically active region can be maintained. As a result, thermal carrier loss from the optically active region is not increased as a result of the strain applied to the optically active region.

The strain-applying means used in the present invention is not to be confused with the known technique of inducing permanent compressive strain (about 0.5%) internally of the optically active region during formation of the latter by deliberately adjusting the composition of the optically active layer so that it results in a lattice mismatch with the substrate. Such strains can be accommodated elastically in thin (~100 Å) layers, and result in certain advantageous modifications to the valence band structure (see "Band-Structure Engineering in Strained Semiconductor Lasers" by O'Reilly, E. P. et al, IEEE Journal of Quantum Electronics, Vol 30, No. 2, pages 366–379, February 1994).

The strain-applying means is most preferably arranged to apply, in use, a biaxial compressive strain in the growth plane of the optically active region.

In a first series of embodiments, the strain-applying means utilises differential thermal expansion to induce the required strain in the optically active region. This first series of embodiments may be realised by use of a strain-applying material which acts either directly or indirectly on the optically active region and which has a coefficient of thermal expansion different to that of the optically active region so that, in use, the thermal expansion difference causes biaxial compressive strain in the growth plane of the active region to increase as the temperature of the latter increases.

In one embodiment of the first series, the strain-applying material is provided as a layer surrounding an etched pillar structure or a mesa structure including the optically active region and has a coefficient of thermal expansion which is greater than that of the optically active region by an amount which produces the required strain characteristics in use. Such layer of strain-applying material may be externally confined so as to promote application of an inwardly directed compressive strain on the pillar or mesa structure, e.g. by application of a layer of low thermal expansion coefficient, e.g. $SiO_2$, on top of the layer of strain-applying material.

The strain-applying material may be a suitably temperature resistant polymer material, e.g a polyimide (e.g. KAPTON), having an upper working temperature of about 250–300° C. Such materials have a wide variety of coefficients of thermal expansion ranging from several times to several tens of times that of the optically active region (e.g. GaAs materials have a coefficient of thermal expansion of $6.6 \times 10^{-6} K^{-1}$), and so enable the selection of an appropriate material of construction for the strain-applying means.

In another embodiment of the first series, the strain-applying material is provided as another layer in a stacked multi-layer structure including the optically active region (e.g. to replace the usual substrate) and has a coefficient of thermal expansion which is less than that of the optically active region. In such a case, the strain-applying material may be a layer of synthetic diamond which has the dual advantage of a very low coefficient of thermal expansion ($1–2 \times 10^{-6} K^{-1}$) and a large thermal conductivity ($1500 Wm^{-1} K^{-1}$ at 20° C.). Such a layer may conveniently replace the substrate upon which an array of devices have been grown.

In a second series of embodiments, the strain-applying means may comprise a mechanical force generator, for example a piezoelectric transducer, to induce the required strain in the optically active region. Such a mechanical force generator may be incorporated into a single optoelectronic device or it may be arranged to act on an array of two or more optoelectronic devices, e.g. by acting on a wafer containing an array of such devices.

In all of the above-described embodiments, it is preferred for the force developed on the optically active region to be a compressive strain which is, typically, up to about 1%. By arranging for the strain-applying means to develop a progressively increasing biaxial compressive strain in the growth plane of the device as it heats up, it is possible to counteract the effect of the temperature rise on the gain spectrum peak.

The strain-applying means may be arranged so as to maintain a substantial match between the gain spectrum peak and the cavity mode as the temperature varies, or it may be arranged to maintain a substantially constant offset or mismatch between the cavity mode of the device and the gain spectrum peak. The offset will usually be such that the cavity mode wavelength is slightly shorter than the gain spectrum peak, typically about 5% or less. This improves the ability to maintain fundamental transverse mode operation as the drive current is increased, such as is described in Japanese Journal of Applied Physics, Vol. 32 Part 2, No. 11A (1993), pages L1612–L1614.

Figure 3A:
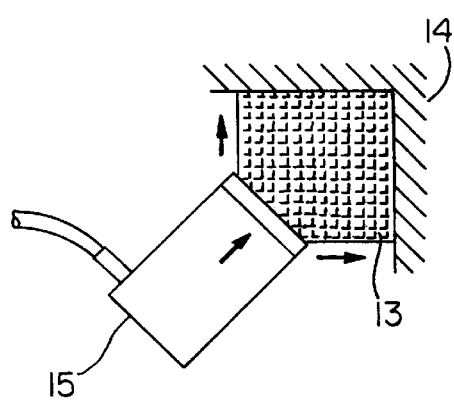
Figure 2A:
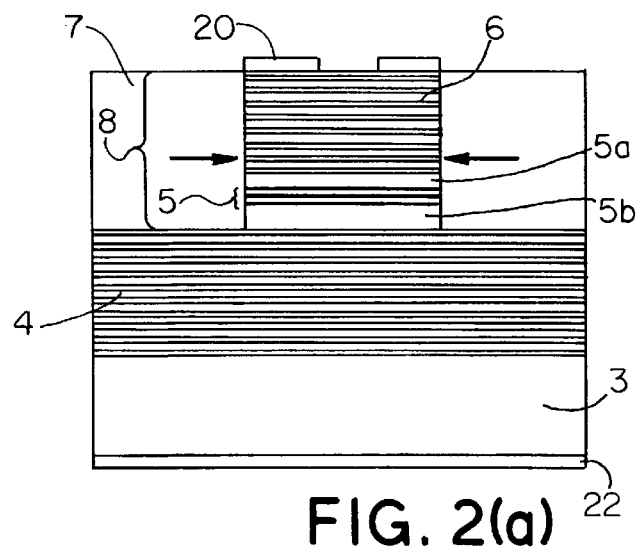
Figure 3B:
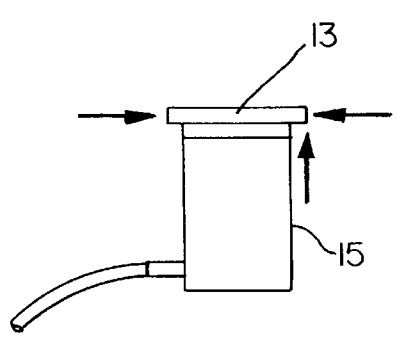
Figure 2B:
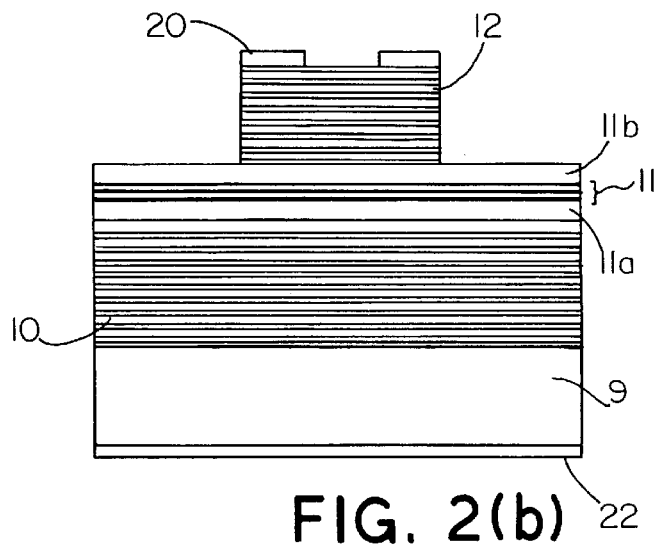

Embodiments of the present invention will now be described in more detail, by way of example, with reference to the accompanying drawings, in which:

FIG. 1 is a schematic diagram to illustrate how the cavity mode spectrum and gain spectrum of a VCSEL move as a function of temperature, FIG. 2(a) is a schematic diagram of a VCSEL device according to a first embodiment of the present invention, FIG. 2(b) is a schematic diagram of a VCSEL device in accordance with a second embodiment of the present invention, FIG. 3(a) is a schematic diagram of an array of VCSEL devices in accordance with a third embodiment of the present invention, and FIG. 3(b) is a schematic diagram of an array of VCSEL devices in accordance with a fourth embodiment of the present invention.

Referring now to FIG. 2(a), the VCSEL device comprises an $n^+$-type semiconductor substrate 3, an n-type lower DBR reflector 4, an n-type barrier layer 5a, a multi-quantum well (MQW) optically active region 5, a p-type barrier layer 5b and a p-type upper DBR reflector 6. The n-type barrier layer 5a, the MQW optically active region 5, the p-type barrier layer 5b and the upper DBR reflector 6 form an etched-pillar structure 8 and, together with the lower DBR reflector 4, define the cavity of the device. Alternatively, these layers may form a mesa structure.

In accordance with the present invention, a dielectric, synthetic polymer material 7 surrounds the etched-pillar structure and has a thermal expansion coefficient greater than that of the optically active region 5.

The VCSEL device is provided with the usual electrical supply contacts which, in this embodiment, are in the form of an upper annular contact 20 on the upper DBR reflector 6 and a lower contact 22 on the underside of the substrate 3.

During normal operation, the device will heat up, causing the dielectric material 7 adjacent the pillar structure to expand and exert a progressively increasing biaxial compressive strain on the MQW optically active region 5 in the growth plane of the latter.

In another embodiment (not shown), a low thermal expansion coefficient material, such as $SiO_2$, is provided over the material 7 to prevent it from relaxing in a direction perpendicular to the direction of application of compressive strain, whereby to promote application of a radially inwardly directed compressive strain on the pillar structure and thereby on both the optically active region 5, the barrier regions 5a and 5b and the upper DBR reflector 6.

The method of forming the above device comprises epitaxially growing in turn on the substrate 3, the n-type lower DBR reflector 4, the n-type barrier layer 5a, the MQW optically active region 5, the p-type barrier layer 5b and the p-type upper DBR reflector 6. The p-type upper DBR reflector 6, the p-type barrier layer 5b, the MQW optically active region 5 and the n-type barrier layer 5a are then selectively etched to form a pillar structure 8.

The dielectric material 7 is then deposited as a layer around the pillar structure by known spin-coating and lithographic techniques.

In a typical example, the materials of construction of the substrate and the various layers for a GaAs VCSEL device is as follows:

| | |
|---|---|
| Substrate 3 | GaAs. |
| Reflector 4 | AlAs/GaAs multilayer DBR. |
| Barrier layer 5a | $Al_{0.5}Ga_{0.5}As$. |
| Optically active region 5 | 3 × $In_{0.2}Ga_{0.8}As$ quantum wells with GaAs barrier layers. |
| Barrier layer 5b | $Al_{0.5}Ga_{0.5}As$. |
| Reflector 6 | AlAs/GaAs multilayer DBR. |
| Dielectric material 7 | Polyimide. |

Referring now to FIG. 2b, the device is a VCSEL comprising a substrate 9, a p-type DBR reflector 10, a p-type barrier layer 11a, a MQW optically active region 11, an n-type barrier layer 11b, and an n-type DBR reflector 12. The thermal expansion coefficient of the substrate 9 is lower than that of the other layers of the device and constitutes the strain-applying means of the present invention. Such strain-applying means serves to cause a progressively increasing biaxial compressive strain in the active region 11 by acting via the reflector 10 to oppose thermal expansion of the active region 11.

The VCSEL device is provided with the usual electrical supply contacts which, in this embodiment, are in the form of an upper annular contact 20 on the DBR reflector 12 and a lower contact 22 on the underside of the substrate 9.

A method for forming the above device comprises the steps of epitaxially growing on an initial substrate (not shown), the n-type DBR reflector 12, the n-type barrier layer 11b, the MQW optically active region 11, the p-type barrier layer 11a and the p-type DBR reflector 10 using known deposition techniques.

This initial substrate is subsequently removed using a known technique, for example one of the techniques taught by Applied Physics Letters, Vol. 64, No. 12, pages 1466–1468 (1994) or Electronics Letters, Vol. 30, No. 15, pages 1235–1236 (1994). The p-type DBR reflector 10 is then bonded to the substrate 9 which has a lower thermal expansion coefficient than the p-type DBR reflector 10 and the other layers of the device including the optically active region 11.

The substrate 9 of the lower thermal expansion coefficient is pressure bonded to the p-type DBR reflector 10 in a high temperature reactor (not shown) at about 800° C. An example of such a technique is given in Applied Physics Letters Vol. 56, No. 8, pages 737–739 (1990).

In this embodiment, the substrate 9 is formed of synthetic diamond. Synthetic diamond has the dual advantage of possessing a very low thermal expansion coefficient (1–2× $10^{-6}K^{-1}$) and a large thermal conductivity (1500 $Wm^{-1}K^{-1}$ at 20° C.).

The contacts 20 and 22 can be formed in any suitable manner known per se, such as by deposition of metal layers and etching as required.

Referring now to FIG. 3(a), there is shown a device wafer 13 containing a plurality of VCSELs in a two-dimensional array. The device wafer 13 is held by a rigid mount 14 and has an area of approximately 1 $cm^2$. Two adjacent side edges of the device wafer 13 engage against the mount 14. A low voltage ceramic-based piezoelectric transducer 15 is mechanically held fixed relative to the rigid mount 14. The transducer 15 engages a chamfered corner of the device wafer 13 defined between the other two adjacent side edges of the device wafer 13. A control unit (not shown) supplies a control signal to the transducer 15 and varies the control signal in response to changes in temperature of the optically active regions of the VCSELs. A bi-axial compressive strain is consequently applied directly to the device wafer 13, and thereby to each of the optically active regions of the VCSELs in the two-dimensional array on the device wafer 13. If desired, the substrate of the device wafer 13 may be thinned by polishing and/or wet/dry etching in order to facilitate application of the compressive strain to the optically active regions.

The above device structure is also applicable to a supporting substrate or heatsink to which diced DFB laser diodes have been bonded. The transducer 15 is then, as before, mechanically held fixed relative to the rigid mount 14.

Referring now to FIG. 3(b), device wafer 13 containing a plurality of VCSELs in a two-dimensional array is bonded to the piezoelectric element of ceramic-based piezoelectric transducer 15. A controller unit (not shown) is again provided to supply a control signal to the transducer 15 in response to changes in temperature of the optically active region of the VCSELs. The applied control signal causes the piezoelectric element of the transducer 15 to extend. Such extension is accompanied by biaxial contraction of the piezoelectric element in a plane perpendicular to its direction of extension, thereby applying an in-plane bi-axial compressive strain to the wafer 13 which is bonded to the piezoelectric element.

In the above-described embodiment, the wafer 13 is bonded directly to the piezoelectric element of the transducer 15. However, if a commercial piezoelectric transducer having a metal protective cap is used, such metal cap (which normally protects the piezoelectric element) is removed.

What is claimed is:

1. A single cavity mode optoelectronic device, comprising:

an optically active region allowing a single cavity mode to exist within a gain spectrum thereof, the active region being arranged such that the optoelectronic device operates as a surface-emitting type device; and a strain-applying means which is arranged to apply to the active region a strain which varies with temperature in a manner which at least partly compensates for temperature-induced changes in the gain spectrum peak of the optically active region.

2. A single cavity mode optoelectronic device according to claim 1, wherein the strain-applying means is arranged to apply a biaxial compressive strain on the optically active region.

3. A single cavity mode optoelectronic device according to claim 1, wherein the strain-applying means is arranged so as to maintain a substantial match between the gain spectrum peak and the cavity mode as the temperature varies.

4. A single cavity mode optoelectronic device according to claim 1, wherein the strain-applying means is arranged to maintain a substantially constant offset or mismatch between the cavity mode of the device and the gain spectrum peak.

5. A single cavity mode optoelectronic device according to claim 1, wherein the strain-applying means acts either directly or indirectly on the optically active region and is formed of a strain-applying material having a coefficient of thermal expansion different to that of the optically active region.

6. A single cavity mode optoelectronic device according to claim 5, wherein the strain-applying material is provided as a layer surrounding an etched pillar structure or a mesa structure including the optically active region and has a coefficient of thermal expansion which is greater than that of the optically active region by an amount which produces the required strain characteristics in use.

7. A single cavity mode optoelectronic device according to claim 6, wherein the layer of strain-applying material is externally confined so as to promote application of an inwardly directed compressive strain on the pillar or mesa structure.

8. A single cavity mode optoelectronic device according to claim 5, wherein the strain-applying material is a temperature resistant polymer material.

9. A single cavity mode optoelectronic device according to claim 5, wherein the strain-applying material is provided as another layer in a stacked multi-layer structure including the optically active region and has a coefficient of thermal-expansion which is less than that of the optically active region.

10. A single cavity mode optoelectronic device according claim 9, wherein said another layer is a substrate which is different from a substrate upon which the multilayer structure has been grown.

11. A single cavity mode optoelectronic device according to claim 9, wherein the strain-applying material is synthetic diamond.

12. A single cavity mode optoelectronic device according to claim 1, wherein the strain-applying means comprises a mechanical force generator.

13. A single cavity mode optoelectronic device according to claim 12, wherein the mechanical force generator is a piezoelectric transducer.

14. A device according to claim 12, wherein the mechanical force generator is incorporated into a single optoelectronic device.

15. A single cavity mode optoelectronic device according to claim 12, forming part of an array of single cavity mode optoelectronic devices, and wherein the mechanical force generator is arranged to act on the optically active region in each device of the array.

* * * * *